United States Patent [19]
Tran

[11] Patent Number: 4,757,523
[45] Date of Patent: Jul. 12, 1988

[54] HIGH SPEED TESTING OF INTEGRATED CIRCUIT

[75] Inventor: Bao G. Tran, Houston, Tex.

[73] Assignee: Texas Instruments Incorporated, Dallas, Tex.

[21] Appl. No.: 947,329

[22] Filed: Dec. 29, 1986

Related U.S. Application Data

[62] Division of Ser. No. 636,941, Aug. 2, 1984, Pat. No. 4,661,930.

[51] Int. Cl.[4] .................. G06F 11/08; G11C 29/00
[52] U.S. Cl. .................................. 377/29; 365/201; 365/236; 371/24
[58] Field of Search .............. 377/29, 31; 365/201, 365/236; 371/24

[56] References Cited

U.S. PATENT DOCUMENTS

| | | | |
|---|---|---|---|
| 4,156,819 | 5/1979 | Takahashi et al. | 365/201 |
| 4,189,635 | 2/1980 | Sheller | 377/29 |
| 4,195,770 | 4/1980 | Benton et al. | 371/24 |
| 4,419,747 | 12/1983 | Jordan | 365/201 |
| 4,519,090 | 5/1985 | Stackhouse et al. | 377/29 |

Primary Examiner—John S. Heyman
Attorney, Agent, or Firm—John G. Graham

[57] ABSTRACT

A register of the type used on as address counter in a dynamic RAM is tested by a method which does not require cycling through every possible value of the register contents. The counter is first loaded with a fixed value, all 1's or all 0's, and the contents checked by an AND or OR gate, producing a one-bit output which is monitored off-chip. Then, the carry feedback path to the counter register is altered, as by inverting all but the LSB, and the contents again checked, using the one-bit output via the AND or OR. In this manner, the operation of the counter is tested in three cycles.

15 Claims, 7 Drawing Sheets

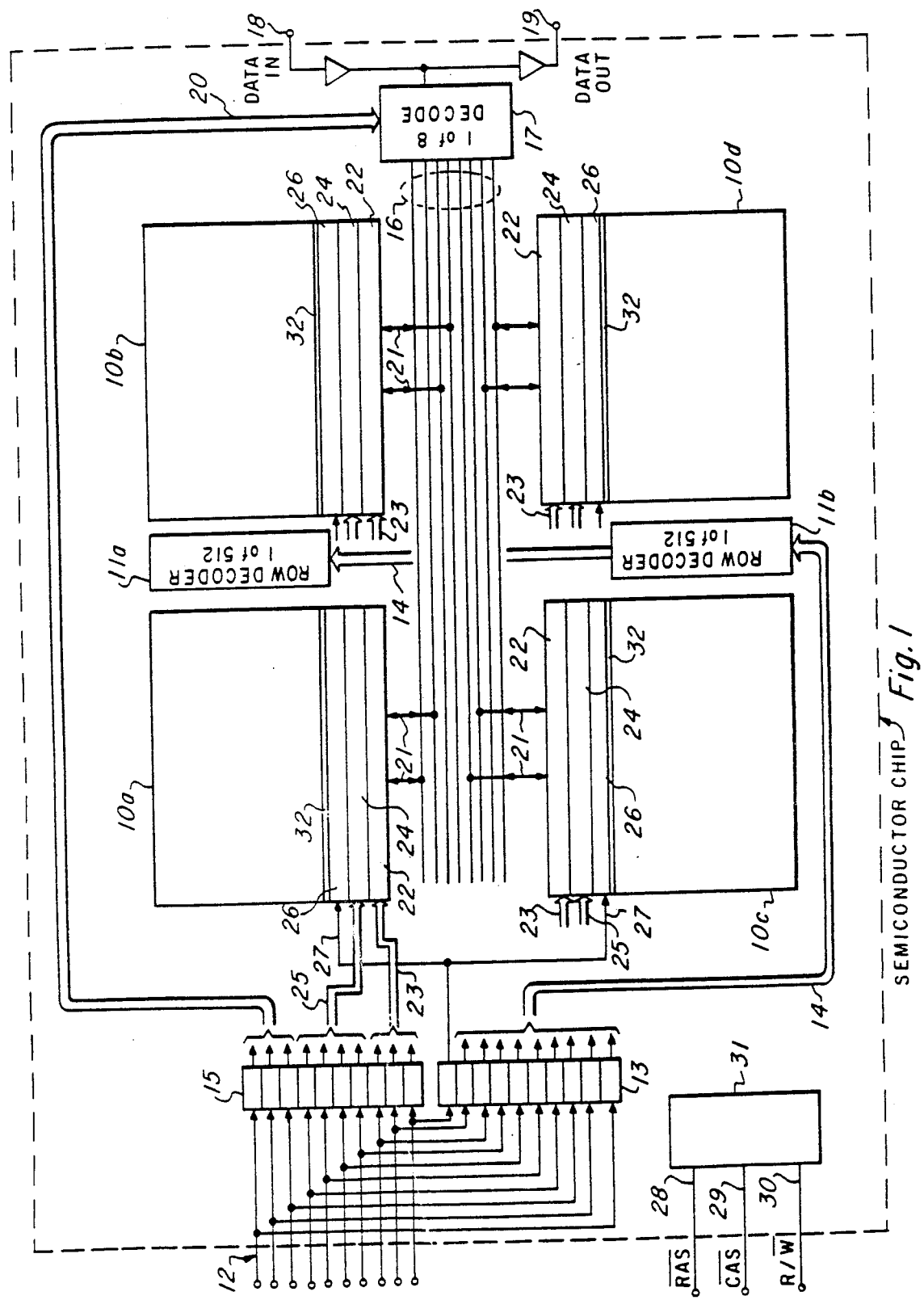

4,757,523

HIGH SPEED TESTING OF INTEGRATED CIRCUIT

RELATED CASES

This application is a division of application Ser. No. 636,941, filed Aug. 2, 1984, now U.S. Pat. No. 4,661,930, and discloses subject matter also disclosed in copending applications Ser. No. 626,791, filed July 2, 1984, now U.S. Pat. No. 4,630,240; Ser. No. 630,507, filed July 11, 1984, now U.S. Pat. No. 4,658,382; Ser. No. 634,898, filed July 26, 1984, now U.S. Pat. No. 4,658,377; Ser. No. 634,901, filed July 26, 1984, now U.S. Pat. No. 4,618,947; Ser. No. 640,716, filed Aug. 14, 1984, now U.S. Pat. No. 4,670,878; and Ser. No. 640,717, filed Aug. 14, 1984, now U.S. Pat. No. 4,654,827; all assigned to Texas Instruments.

BACKGROUND OF THE INVENTION

This invention relates to semiconductor devices, and more particularly to circuits for rapid testing of registers and the like in dynamic memory devices.

Dynamic MOS read/write memory devices have been constructed generally as shown in U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, both assigned to Texas Instruments. When memory devices of this type are manufactured in higher densities, such as 256K and 1-Megabit and beyond, the problem of testing all of the cells and all of the other circuits on the chip becomes formidable.

Testing problems are increased when functions are added to the memory devices. For example, a self-refresh function as disclosed in U.S. Pat. No. 4,207,618, issued to White and Rao, assigned to Texas Instruments, requires a row address counter to be included on the chip. In a 1-Meg device, refreshed at 512 cycles per period, this means that a 9-bit counter is required; a 9-bit counter needs 512 cycles to be completely tested by conventional methods. Similarly, a counter used in a device having an extended nibble mode may require a lengthy test period.

It is the principal object of this invention to provide improved test circuitry for high density dynamic RAM devices, particularly for testing counter registers and the like. Another object is to provide testing circuitry for a CMOS dynamic RAM in which the testing time is minimized, and the circuitry added to the device is minimized. A further object is to provide high speed test circuitry for semiconductor devices which contain registers for counting and the like.

SUMMARY OF THE INVENTION

In accordance with one embodiment of the invention, a register of the type used as an address counter in a dynamic RAM is tested by a method which does not require cycling through every possible value of the register contents. The counter is first loaded with a fixed value, all 1's or all 0's, and the contents checked by an AND or OR gate, producing a one-bit output which is monitored off-chip. Then, the carry feedback path to the counter register is altered, as by inverting all but the LSB, and the contents again checked, using the one-bit output via the AND or OR. In this manner, the operation of the counter is tested in three cycles.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1A:
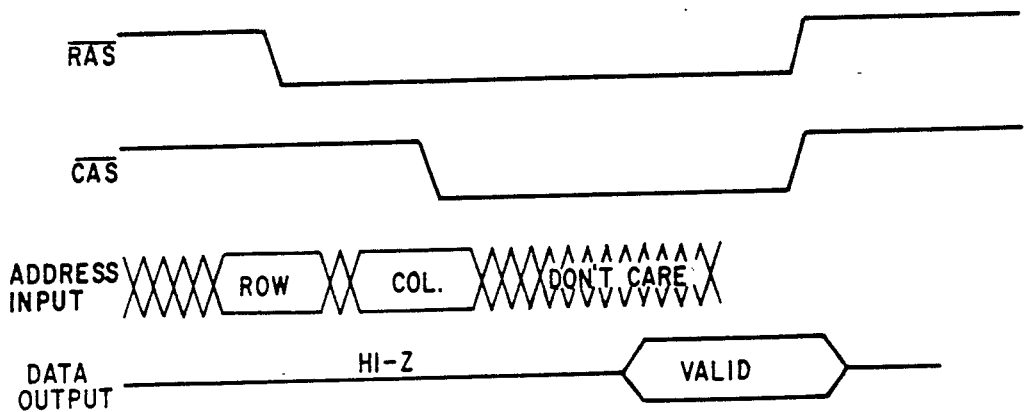
FIG. 1 is an electrical diagram in block form of the row address buffers with refresh counter in a memory device which may be tested according to the invention.
Figure 1A:
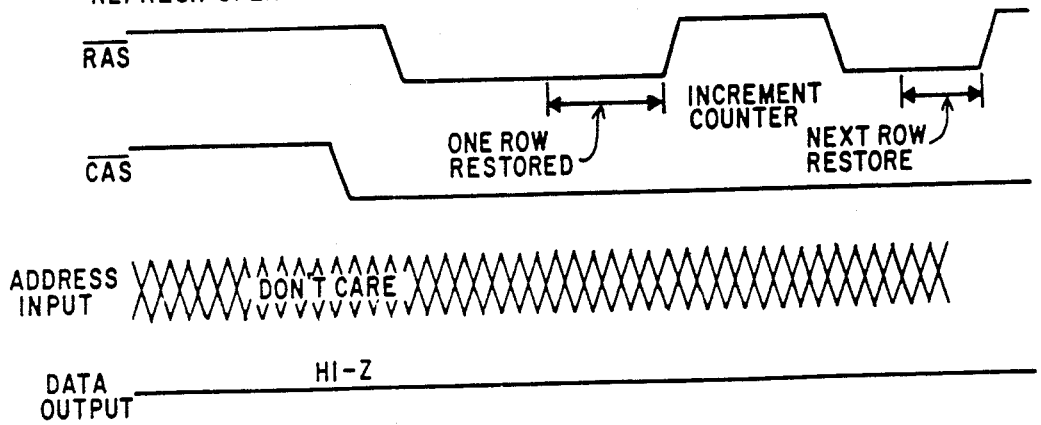

Referring to FIG. 1 of U.S. Pat. No. 4,661,930, incorporated herein by reference, a block diagram of one example of a semiconductor read/write memory chip is illustrated which may use test circuitry constructed according to the invention. This device of U.S. Pat. No. 4,661,930 is of the so-called 1-Megabit size, having $2^{20}$ or 1,048,576 memory cells in an array of rows and columns. The array is partitioned into four identical blocks, with each block containing 262,144 cells.

Each block of the array of U.S. Pat. No. 4,661,930 contains two rows of dummy cells 32 in the usual manner, as discussed in the above-mentioned U.S. Pat. Nos. 4,239,993 or 4,081,701.

Figure 2:
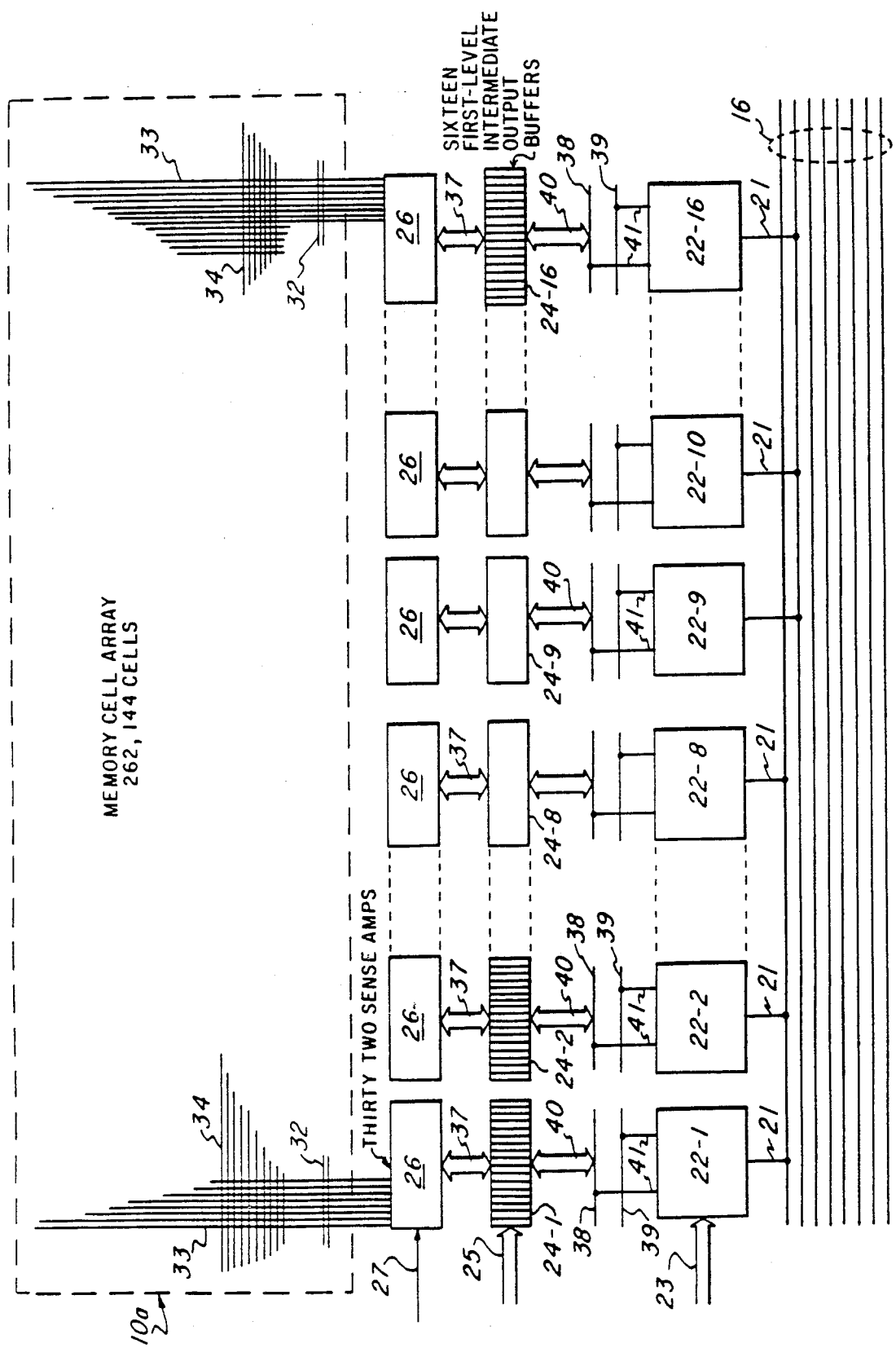
FIG. 2 is a more detailed electrical diagram of the refresh address counter of FIG. 1, including the test function, according to the invention.
Figure 3:
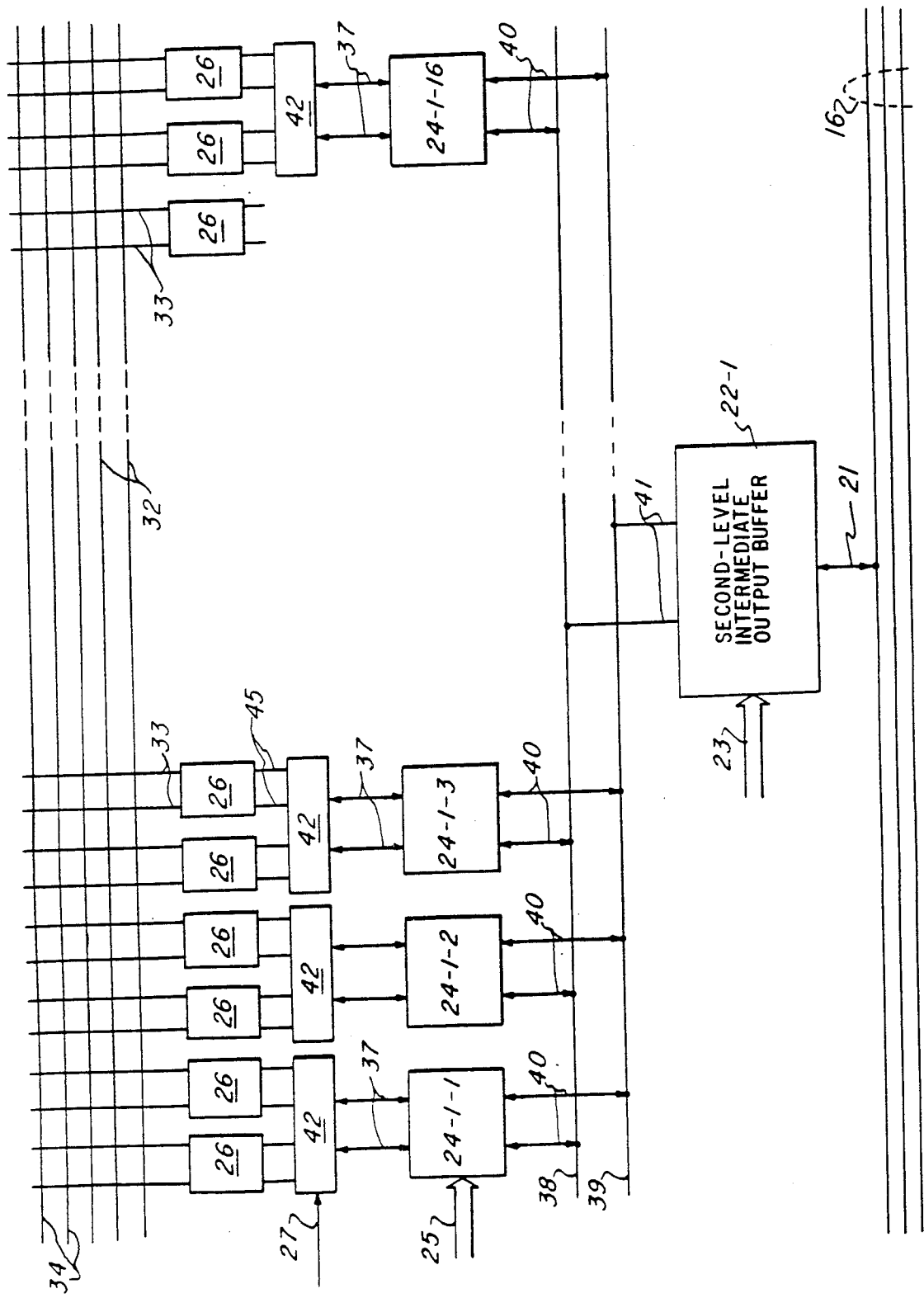
Figure 4:
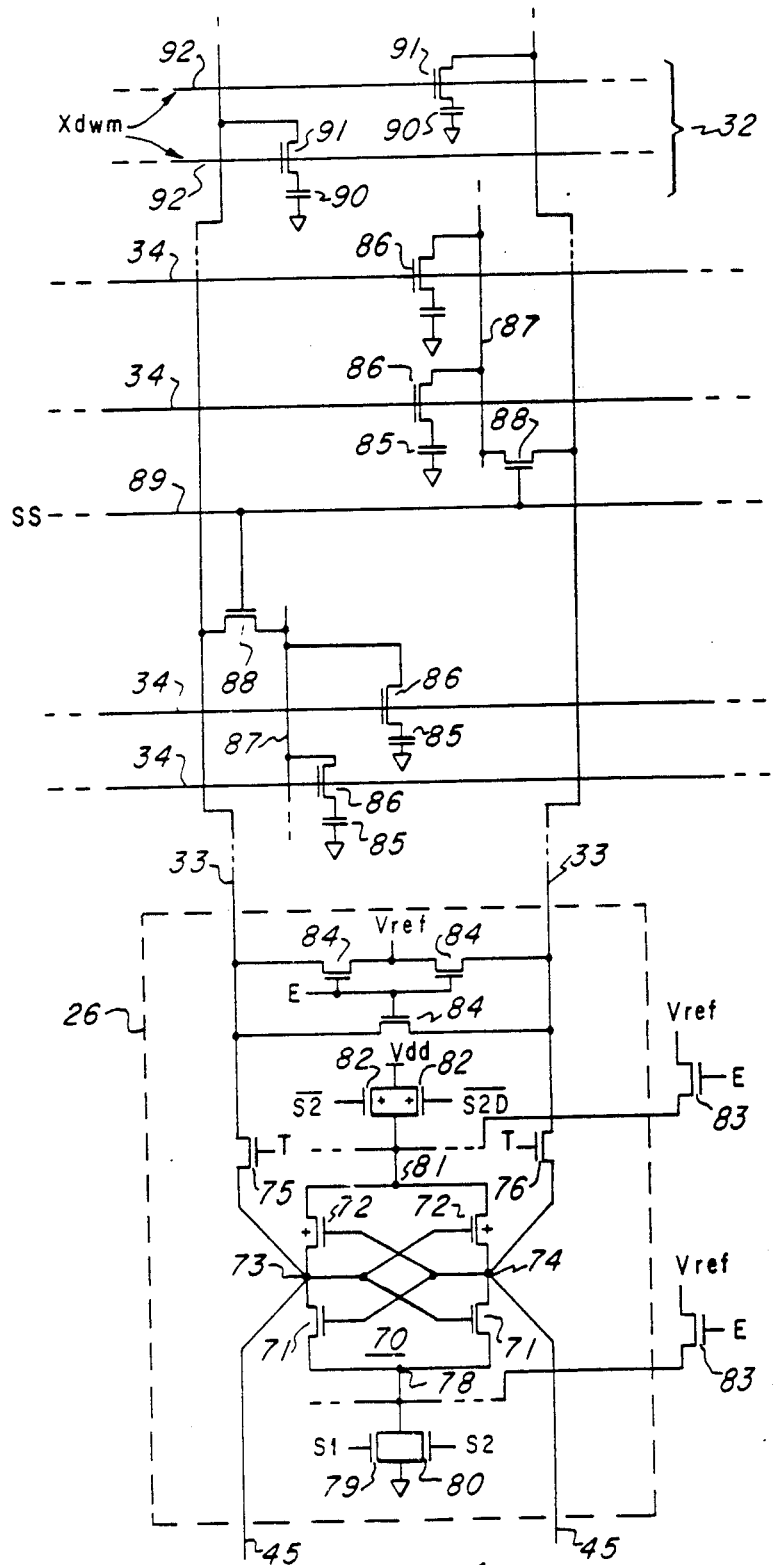
Figure 5:
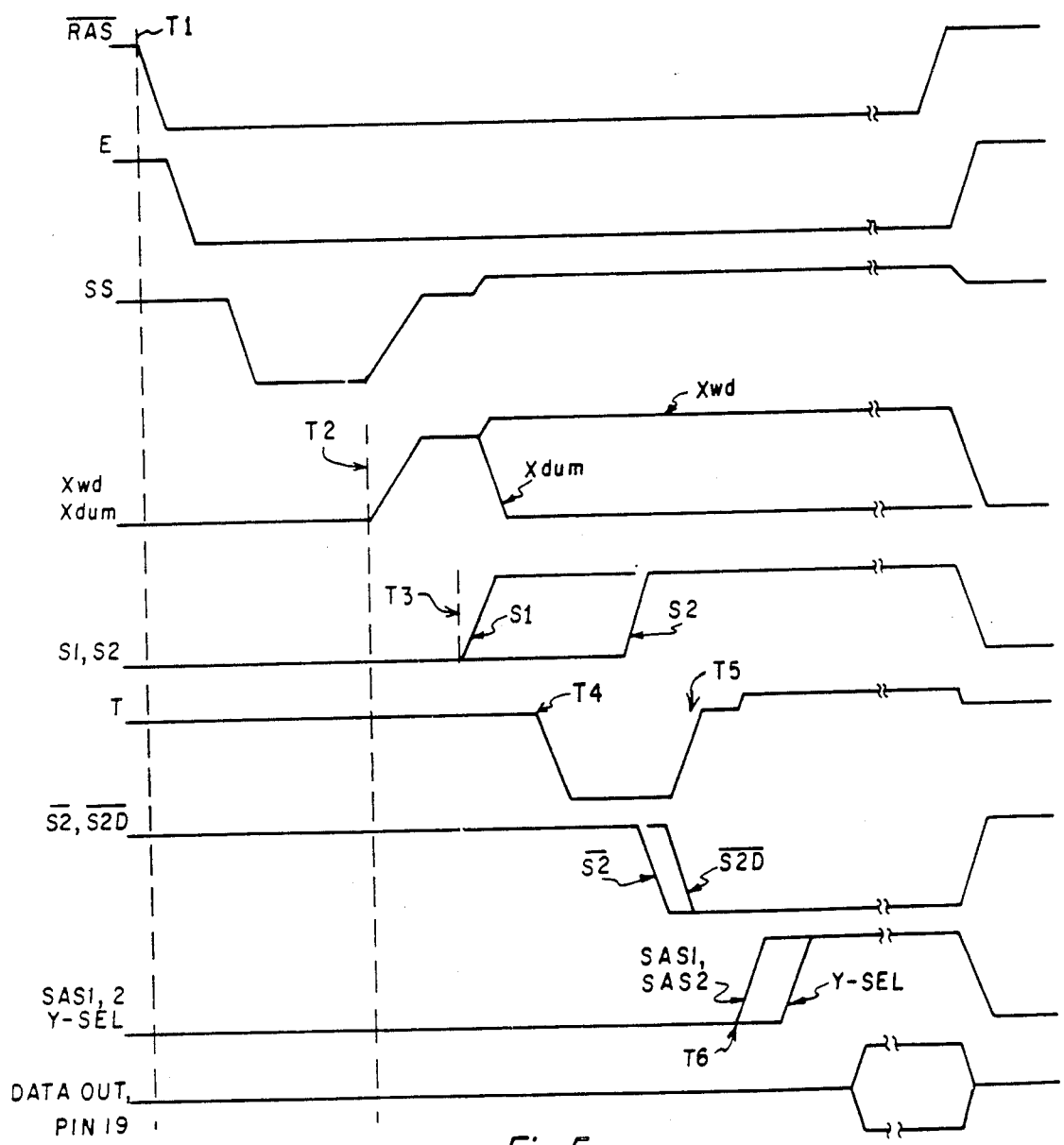
Figure 6:
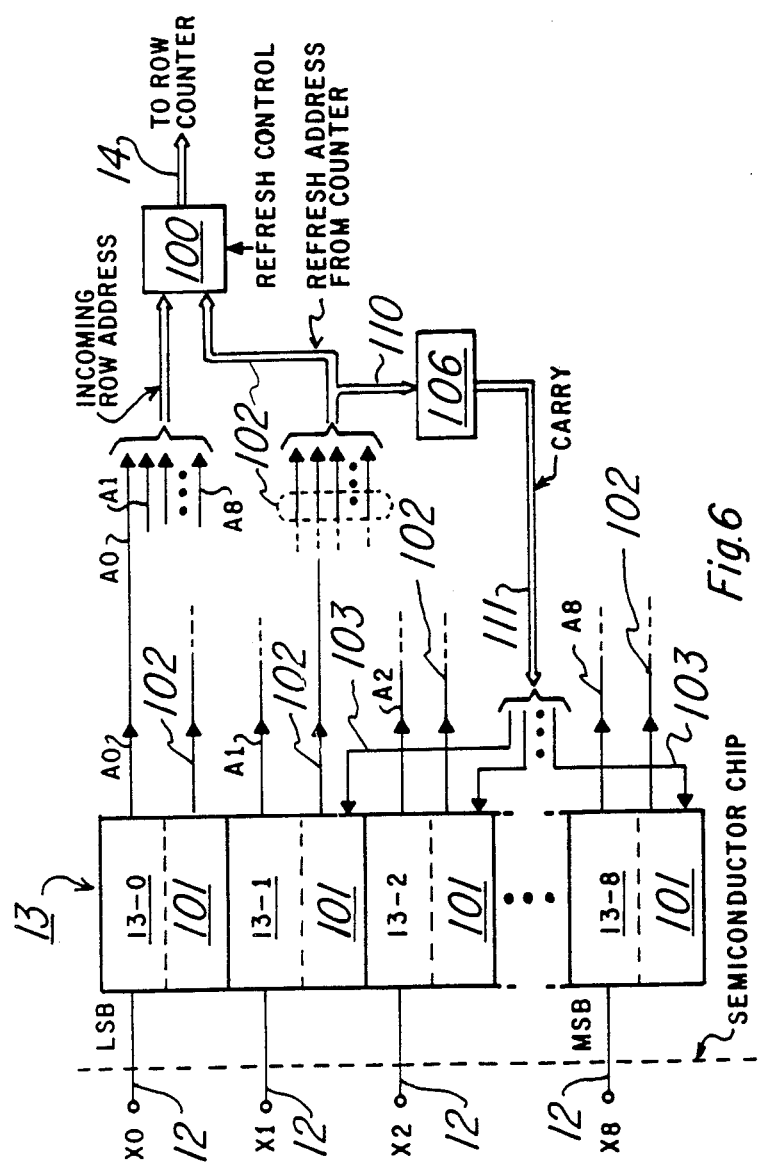

With reference to FIGS. 1 and 2, according to the invention, the 9-bit row address counter is constructed within the address buffers 13 of the memory device of U.S. Pat. No. 4,661,930 to allow testing of the counter itself without merely stepping through the entire count of 512 cycles. A multiplexer 100 selects either the incoming row address of internal counter, depending upon the sequence of $\overline{RAS}$ and $\overline{CAS}$. The counter consists of, in this case, nine counter stages 101 of conventional form, connected as a binary counter by feedback from the counter stage outputs 102 to input 103 by decoder circuit 106. In ordinary operation the counter is incremented by a refresh control RF input 105 which would be generated in the circuitry 31 when $\overline{CAS}$ falls before $\overline{RAS}$, signalling a refresh-only cycle using an internal row address. The input 105 toggles the LSB of the counter stages 101, and each successively higher stage is toggled or not as determined by the decoder 106, so a binary count of 0-to-511 is implemented as 512 RF pulses are applied in succession to the input 105. The nine bit output on the lines 102 is applied to the input of the decoder 106 by lines 110, and the outputs 111 of the decoder are applied to the inputs 103 of the counter stages 101.

In order to provide a rapid test capability, each of the counter stages 101 also has an input 112, so the counter may be loaded in parallel with all 1's. These inputs correspond to a "set" input of a flip-flip. In addition, a Test input on a line 113 functions to select either an inverting or a non-inverting path 114 or 115 between the each decoder output 111 and the counter stage input 103, except for the LSB. This can reverse the normal function of the feedback through the inverter.

The counter output on lines 102 and 110 is applied to the nine inputs of an AND logic gate 118, so if all of the outputs 102 are 1's an output 119 from this gate is high, and an output pad 120 will be driven high if a buffer 121 is turned on by a control 122. In like manner, all of the outputs 102 and 110 are applied to the nine inputs of an OR gate 124, which produces a "0" output 125 if all of the lines 102 are low; this output 125 drives the pad 120 by buffer 126 if a control 127 is on. The pad 120 usually would be the data output terminal 19, or it may be another of the terminals; the buffers 121 and 126 are activated only in the test condition and will not interfere with normal use of the pad in standard read/write operations.

The purpose of the test circuitry is first to check that each of the counter register stages can flip from a 0 state to a 1 state, and back from a 1 to a 0, and second to check that the counter decoder 106 correctly determines the carry bits. The test operation begins with loading the counter 101 with all 1's by the inputs 112, and at this point, using a standard LSI I/C test machine, the condition is detected at the pad 120 due to the action of the AND gate 118; thus, in the cycle that the inputs 112 load 1's to the counter, the control 122 goes high to produce an output through the buffers 121. In the next cycle the Test control on the line 113 goes to an active low condition, the LSB is toggled, and all of the bits of the register 101 will flip to 0. The OR gate 124 produces an output on pad 120 through the buffer 126 because the controls 122 and 127 are flipped, and this monitors a 0 on the outputs 102 of the counter, due to the standard operation of the carry through the decoder 106, implementing a binary count. The next step is to again toggle the Test voltage on line 113, which should cause the counter to go from 0 to 1 for all bits; because the carry feedback to all bits except LSB is inverted; the test controls 122 and 127 are reversed so the AND gate 118 allows the all-1 condition to be monitored on the pad 120. Thus, in three cycles, the performance of all bits of the register in flipping from 1-to-0 and 0-to-1, and feedback through the decoder 106, is checked.

The test mode of operation is established by a special input condition which would not occur in normal operation. The test mode is entered only in the manufacturing test procedures. For example, while the slice is at a multiprobe station, before being broken into individual chips, a test pad may be activated by an electrical probe; this would not be one of the boding pads used for input or output of addresses, data or controls in normal operation. Also, an over-voltage condition on one of the terminals used in normal operation may be used to trip a test control circuit when at the test station. A test control circuit as seen in FIG. 2 detects this condition and generates the controls 113, 122 and 127 in successive $\overline{RAS}$ cycles.

When this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A counter circuit having a test mode of operation, comprising:

a plurality of binary counter stages, each stage having an input and an output, decoder means having an input receiving all of said outputs from the counter stages and coupling means applying selected signals to said inputs of the counter stages, means to add a binary 1 to the least significant bit of the counter stages, logic gate means receiving all of said outputs of the counter stages to produce a single output in a test mode, said coupling means including means for inverting said selected signals in said test mode.

2. A circuit according to claim 1 wherein said logic gate means includes an AND gate.

3. A circuit according to claim 1 wherein said logic gate means includes an OR gate.

4. A circuit according to claim 1 wherein said logic gate means includes an AND gate and an OR gate.

5. A circuit according to claim 4 including means for activating said AND gate and said OR gate in successive operating cycles.

6. A circuit according to claim 5 including means for activating said means for inverting on one of said successive operating cycles but not in the other.

7. A method of testing a multiple-bit counter register in a semiconductor memory device or the like comprising the steps of:

loading a fixed value into said register, said fixed value selected from a set of fixed values including all 1's and all 0's, detecting the contents of said register in logic means and producing an indication at a single terminal of said device of the presence of said fixed value in said register, said indication having significantly fewer bits than said register, altering the contents of said register according to a selected function of said fixed value, again detecting the contets of said register in said logic means and producing an indication at said terminal of said device of the presence of said selected function of the fixed value.

8. A method according to claim 7 including the steps of:

again altering the contents of said register according to another selected function of the contents of said register.

9. A method according to claim 8 including the step of again detecting the contents of said register and producing said indication at said terminal.

10. A method according to claim 7 wherein said fixed value is all 1's.

11. A method according to claim 10 wherein said first step of detecting employs determining an AND logic function of the contents of the register.

12. A method according to claim 11 wherein said second step of detecting employs determining an OR logic function of the contents of the register.

13. A method according to claim 7 wherein said step of altering includes toggling the LSB of the register and transposing the carry between bits of the register to produce a condition where all bits of the register should be the same.

14. A method according to claim 13 wherein said device is an integrated circuit.

15. A method according to claim 7 wherein said device is an integrated circuit.

* * * * *